United States Patent
Shindo et al.

(10) Patent No.: US 9,476,134 B2
(45) Date of Patent: *Oct. 25, 2016

(54) HIGH PURITY COPPER AND METHOD OF PRODUCING HIGH PURITY COPPER BASED ON ELECTROLYSIS

(71) Applicant: JX Nippon Mining & Metals Corporation, Tokyo (JP)

(72) Inventors: Yuichiro Shindo, Ibaraki (JP); Susumu Shimamoto, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 574 days.

This patent is subject to a terminal disclaimer.

(21) Appl. No.: 13/945,115

(22) Filed: Jul. 18, 2013

(65) Prior Publication Data

US 2013/0302205 A1 Nov. 14, 2013

Related U.S. Application Data

(62) Division of application No. 12/996,949, filed as application No. PCT/JP2009/066479 on Sep. 24, 2009, now abandoned.

(30) Foreign Application Priority Data

Sep. 30, 2008 (JP) ................................. 2008-253038

(51) Int. Cl.
| | |
|---|---|
| *C25C 1/12* | (2006.01) |
| *C22C 9/00* | (2006.01) |
| *C23C 14/34* | (2006.01) |
| *C25C 7/06* | (2006.01) |

(52) U.S. Cl.
CPC . *C25C 1/12* (2013.01); *C22C 9/00* (2013.01); *C23C 14/3414* (2013.01); *C25C 7/06* (2013.01); *H01L 2924/0002* (2013.01)

(58) Field of Classification Search
CPC ....... C22C 9/00; C23C 14/3414; C23C 9/00; C25C 1/12; C25C 7/06; H01L 2924/0002
See application file for complete search history.

(56) References Cited

U.S. PATENT DOCUMENTS

| | | | |
|---|---|---|---|
| 3,253,910 A | 5/1966 | Burgoff et al. | |
| 3,778,318 A | 12/1973 | Finlay et al. | |
| 4,537,745 A | 8/1985 | Hassler et al. | |
| 4,792,369 A | 12/1988 | Ogata et al. | |
| 4,874,436 A | 10/1989 | Ogata et al. | |
| 5,206,430 A | 4/1993 | Itoh et al. | |
| 6,197,433 B1 | 3/2001 | Hatano | |
| 6,254,702 B1 | 7/2001 | Hana et al. | |
| 6,451,135 B1 | 9/2002 | Takahashi et al. | |
| 6,896,788 B2 | 5/2005 | Shindo et al. | |
| 6,908,517 B2 | 6/2005 | Segal et al. | |
| 6,946,039 B1 | 9/2005 | Segal et al. | |
| 7,435,325 B2 | 10/2008 | Shindo et al. | |
| 7,507,304 B2 | 3/2009 | Okabe et al. | |
| 7,740,721 B2 | 6/2010 | Okabe | |
| 8,192,596 B2 | 6/2012 | Shindo et al. | |
| 8,216,442 B2 | 7/2012 | Shindo et al. | |
| 8,246,764 B2 | 8/2012 | Okabe et al. | |
| 8,728,255 B2 | 5/2014 | Fukushima et al. | |
| 2001/0004856 A1 | 6/2001 | Nishi et al. | |
| 2002/0083571 A1 | 7/2002 | Lee et al. | |
| 2002/0122913 A1 | 9/2002 | Nee | |
| 2005/0121320 A1 | 6/2005 | Okabe et al. | |
| 2005/0161126 A1 | 7/2005 | Aruga et al. | |
| 2005/0236074 A1 | 10/2005 | Mihara et al. | |
| 2007/0051624 A1 | 3/2007 | Okabe et al. | |
| 2007/0148032 A1 | 6/2007 | Aruga et al. | |
| 2008/0025867 A1 | 1/2008 | Aruga et al. | |
| 2008/0047634 A1 | 2/2008 | Mihara et al. | |
| 2008/0223728 A1 | 9/2008 | Shindo et al. | |
| 2009/0004498 A1 | 1/2009 | Shindo et al. | |
| 2009/0010797 A1 | 1/2009 | Aruga et al. | |
| 2009/0101243 A1 | 4/2009 | Aruga et al. | |
| 2009/0162685 A1 | 6/2009 | Kobayashi et al. | |

(Continued)

FOREIGN PATENT DOCUMENTS

| | | |
|---|---|---|
| CN | 1370853 A | 9/2002 |
| CN | 101199988 A | 6/2008 |

(Continued)

OTHER PUBLICATIONS

S. Fujiwara et al., "Ductility of Ultra High Purity Copper", Journal De Physique IV, Colloque C7, Supplement au Journal de Physique III, vol. 5, pp. C7-295-C7-300, Nov. 1995.
Y. Ishikawa et al., "Floating Zone-Melting of Iron and Copper under Reduced Hydrogen Atmosphere", pp. 10-18, Sep. 1995.
Y. Shindo, "Ultra High Purity Materials", pp. 311-320, Dec. 2006.
Zanner et al., "Vacuum Arc Remelting of Alloy 718", The Minerals, Metals & Materials Society, pp. 17-32, 1989 (month unknown).

*Primary Examiner* — Kishor Mayekar
(74) *Attorney, Agent, or Firm* — Howson & Howson, LLP

(57) ABSTRACT

High purity copper having a purity of 6N or higher, wherein content of each of the respective components of P, S, 0, and C is 1 ppm or less, and nonmetal inclusions having a particle size of 0.5 μm or more and 20 μm or less contained in the copper are 10,000 inclusions/g or less. As a result of using high purity copper or high purity copper alloy as the raw material from which harmful P, S, C, O-based inclusions have been reduced and controlling the existence form of nonmetal inclusions, it is possible to reduce the occurrence of rupture of a bonding wire and improve the reproducibility of mechanical properties, or reduce the percent defect of a semiconductor device wiring formed by sputtering a high purity copper target with favorable reproducibility.

4 Claims, No Drawings

(56) References Cited

U.S. PATENT DOCUMENTS

| | | |
|---|---|---|
| 2009/0272466 A1 | 11/2009 | Shindo et al. |
| 2010/0000857 A1 | 1/2010 | Tonogi et al. |
| 2010/0013096 A1 | 1/2010 | Irumata et al. |
| 2010/0163425 A1 | 7/2010 | Shindo et al. |
| 2010/0219070 A1 | 9/2010 | Okabe |
| 2011/0163447 A1 | 7/2011 | Fukushima et al. |
| 2014/0010705 A1 | 1/2014 | Kanou |
| 2014/0097084 A1 | 4/2014 | Nagata et al. |
| 2014/0110849 A1 | 4/2014 | Otsuki et al. |
| 2014/0158532 A1 | 6/2014 | Nagata et al. |

FOREIGN PATENT DOCUMENTS

| | | |
|---|---|---|
| EP | 1247872 A1 | 10/2002 |
| EP | 1903119 A1 | 3/2008 |
| GB | 2157607 A | 10/1985 |
| JP | S61-084389 A | 4/1986 |
| JP | S63-153291 A | 6/1988 |
| JP | 63-297583 A | 12/1988 |
| JP | S64-008289 A | 1/1989 |
| JP | S64-055394 A | 3/1989 |
| JP | 01-152291 A | 6/1989 |
| JP | H01-156441 A | 6/1989 |
| JP | H02-022489 A | 1/1990 |
| JP | 02-185990 A | 7/1990 |
| JP | 05-214519 A | 8/1993 |
| JP | 08-108251 A | 4/1996 |
| JP | 09-025564 A | 1/1997 |
| JP | H10-008244 A | 1/1998 |
| JP | 11-106842 A | 4/1999 |
| JP | H11-135461 A | 5/1999 |
| JP | 11-229172 A | 8/1999 |
| JP | H11-315373 A | 11/1999 |
| JP | 2000-107596 A | 4/2000 |
| JP | 2000-239836 A | 9/2000 |
| JP | 2001-049369 A | 2/2001 |
| JP | 2005-307343 A | 11/2005 |
| WO | 01/94659 A2 | 12/2001 |
| WO | 2006/134724 A1 | 12/2006 |

HIGH PURITY COPPER AND METHOD OF PRODUCING HIGH PURITY COPPER BASED ON ELECTROLYSIS

CROSS REFERENCE TO RELATED APPLICATIONS

This application is a divisional of co-pending U.S. application Ser. No. 12/996,949 which is the National Stage of International Application No. PCT/JP2009/066479, filed Sep. 24, 2009, which claims the benefit under 35 USC 119 of Japanese Application No. 2008-253038, filed Sep. 30, 2008.

BACKGROUND

The present invention relates to high purity copper and a method of producing high purity copper based on electrolysis. The high purity copper produced with the method of the present invention can be used to produce high purity copper alloy by adding the necessary alloy elements. The present invention covers all of the above. Incidentally, "%" and "ppm" as used in this specification respectively represent mass % and mass ppm. Moreover, "purity" represents the purity excluding C, O, N, and H as gas components.

Conventionally, if the aim is to produce high purity copper, emphasis was primarily placed on eliminating metal elements (excluding copper) and nonmetal elements, which are recognized as impurities, and limiting gas components to a constant amount of several ppm to several 100 ppm. Thus, trace amounts of inclusions that existed in the high purity copper were not acknowledged as a problem, and no consideration was given for eliminating or reducing the same. Moreover, even in cases where gas components are limited as much as possible, there was no concern with respect to the mode of existence of the inclusions arising therefrom.

Nevertheless, if there are inclusions other than copper in the high purity copper, even minute and trace amounts, for example, may cause disconnection with such inclusions as the source in the thinning process of the copper bonding wire or problems may arise regarding mechanical properties such as tensile properties, and adverse effects may also be inflicted on the reproducibility of such properties. In addition, when preparing a high purity copper sputtering target for use in semiconductor devices, protrusions (nodules) would arise on the target surface in the process of forming a thin film by way of sputtering, and particles would arise due to the rupture or the like of the protrusions (nodules) caused by an abnormal discharge. Generation of particles causes the percent defective of the semiconductor device to deteriorate.

Conventionally, the recognition was that other causes had a greater influence on the generation of the foregoing particles or the rupture of the bonding wire, and the recognition that minute and trace amounts of inclusions existing in the high purity copper target were the cause was low. Nevertheless, as the conventionally recognized sources of particles and causes of rupture of the bonding wire become clarified and subsequently solved, the new recognition is that other sources of particles exist and that, unless they are solved, it is not possible to realize high quality deposition or obtain a bonding wire that will not rupture easily. To put it differently, existing sputtering targets and bonding wires for forming copper wiring for use in semiconductors are based on the foregoing sophisticated technology level. It should be easy to understand that the high purity copper of the present invention can be applied to all materials that use high purity copper in addition to the use in sputtering targets or bonding wires.

Although the deposition technology of copper wirings or bonding wires for use in semiconductors is well known technology, the principle of the sputtering method, which is sometimes slightly difficult to understand, is briefly explained below. The sputtering method forms a film on a substrate by utilizing the phenomenon where atoms configuring the target are discharged into space and accumulated on the opposing substrate based on the momentum exchange that occurs when the accelerated charged particles collide with the target surface. The sputtering target is usually in the shape of a discoid or rectangular plate, and is used as the sputter source for forming, by way of sputtering, an electrode, gate, element, insulating film, protective film and the like of various semiconductor devices. Generally, as the sputtering target, an aluminum and aluminum alloy target, a copper and copper alloy target, a high melting point metal and alloy target, a metal silicide target and the like are used.

Among the foregoing targets, an important target is a copper and copper alloy target that is used in forming a copper wiring as an alternative of a conventional aluminum wiring. Meanwhile, during the deposition based on sputtering, protrusions having a size of several μm to several mm referred to as nodules sometimes arise on the eroded portion of the sputtering target. There is a problem in that such nodules will burst as a result of colliding with the charged particles in the sputtering process, and thereby cause to generate particles (cluster-shaped coarse fragments) on the substrate.

The generation of particles will increase in proportion to the number of nodules on the eroded surface of the target, and a major issue is to prevent the generation of nodules in order to reduce the problematic particles. In the recent circumstances where LSI semiconductor devices are subject to higher integration and the linewidth thereof being miniaturized to 0.25 μm or less, the generation of particles caused by the foregoing nodules is now being considered a major problem.

Specifically, particles directly adhere to the thin film that is formed on the substrate, or once adhere to and accumulate on the circumferential wall or component of the sputtering device and thereafter flake off and adhere to the thin film again, and cause problems such as the disconnection or short circuit of the wiring. The generation of particles is becoming a major problem pursuant to the advancement of higher integration and miniaturization of the electronic device circuit as described. As described above, causes of the conventionally recognized sources of particles and rupture of the bonding wire are being clarified and many of them have been solved, but the current situation is that it is still insufficient. With the foregoing problems unsolved, it is not possible to achieve high quality deposition or obtain a bonding wire that will not rupture easily.

Conventional technologies are now introduced. Nevertheless, the following conventional technologies have no concern regarding the mode and influence of the minute and trace amounts of inclusions existing in the high purity copper, and do not provide any kind of specific solution therefor. Japanese Published Unexamined Patent Application No. H11-106842 describes cleaning electrolyte based on solvent extraction. Japanese Published Unexamined Patent Application No. 2000-107596 describes eliminating Sb and Bi with chelate resin. Japanese Published Unexamined Patent Application No. S63-297583 describes adding a diaphragm and glue in copper electrolysis to smooth the electrolyzed surface, thereby reducing the uptake of impurities. Japanese Published Unexamined Patent Application No. S64-55394 describes causing anolyte to come in contact with activated carbon in copper electrolysis to eliminate glue. Japanese Published Unexamined Patent Application No. H1-152291 describes performing electrolysis once again in copper electrolysis. Japanese Published Unexamined Patent Application No. S64-8289 describes smoothing the electrode surface based on periodic reverse current electrolysis in copper electrolysis to prevent the inclusion of suspended matter and electrolyte. Japanese Published Unexamined Patent Application No. 2005-307343 describes adding a macromolecular additive to improve the surface condition in copper electrolysis and using electrolyte containing urea to produce high purity copper with a low silver and sulfur content.

Japanese Published Examined Patent Application No. 2004-513228 describes that the three metallurgical characteristics of a sputtering target that affect the performance of a target are the uniformity of the material (no precipitate, void, inclusion and other defects), crystal particle size (finer crystal particle size is generally more preferable than coarse crystal particle size), and texture (texture relates to the strength of a specific crystallographic orientation; a "weak" texture includes substantially random distribution of the crystallographic orientation, and a "strong" texture includes a preferential crystallographic orientation in the distribution of the crystallographic orientation), and further states that, generally speaking, it is necessary to reduce defects such as inclusions in the target.

Japanese Published Unexamined Patent Application No. H5-214519 describes a titanium sputtering target in which the number of inclusions of 1 µm or more existing at the crystal grain boundary of titanium configuring the target is 100 inclusions or less per 1 cm² of the target plane, and additionally describes that the inclusions existing at the crystal grain boundary of titanium are a composite compound based on a combination of one or more types among oxides, nitrides, carbides, sulfides, and hydrides of metal components of titanium or iron, nickel, chromium, aluminum, silicon, tungsten, and molybdenum, and that the oxides can be decomposed by heat treatment.

Japanese Published Unexamined Patent Application Nos. H9-25564 and H11-315373 describe reducing the number of inclusions in an aluminum or aluminum alloy target to be 40 inclusions/cm² or less per unit area, that splashes can be reduced by causing the maximum length of the inclusions to be 20 µm or less, that reducing the inclusions in the sputtering target is particularly important in order to inhibit the generation of particles and splashes, and reducing inclusions by filtering molten metal with a ceramic filter.

Japanese Published Unexamined Patent Application No. 2000-239836 describes a method of producing a high purity copper or copper alloy sputtering target having an oxygen content of 100 ppm or less, carbon content of 150 ppm or less, nitrogen content of 50 ppm or less, and sulfur content of 200 ppm or less, wherein used is a high purity copper or copper alloy ingot in which the oxygen content in the target is 100 ppm or less, the carbon content is 150 ppm or less, the nitrogen content is 50 ppm or less, and the sulfur content is 200 ppm or less, or the number of indications having a flat bottom hole diameter of 0.5 mm or more is 0.014 indications/cm² or less in an ultrasonic inspection performed from the target surface, and obtained by melting and casting based on electron beam melting or vacuum induction skull melting. However, the large inclusions detected in the ultrasonic inspection are not observed in current high purity copper targets.

WO 2004/083482 describes that the gas components of oxygen, nitrogen, and carbon contained in the copper alloy sputtering target form inclusions at the crystal grain boundary and cause the generation of particles, and that it is desirable to reduce such gas components as much as possible since they cause the unexpected generation of particles during the sputter life, and unavoidable impurities excluding gas components are reduced to 10 wtppm or less.

SUMMARY

In light of the foregoing circumstances, an object of this invention is to use high purity copper or high purity copper alloy from which harmful P, S, C, O-based inclusions have been reduced as the raw material and controlling the existence form of nonmetal inclusions, and thereby reduce the occurrence of rupture of a bonding wire and improve the reproducibility of mechanical properties, or reduce the percent defect of a semiconductor device wiring formed by sputtering a high purity copper target with favorable reproducibility.

As a result of intense study to solve the foregoing problems, the present inventors made the following discovery. Specifically, the inventors discovered that, by reducing as much as possible the abundance of nonmetal inclusions having a particle size of 0.5 µm or more and 20 µm or less existing in the high purity copper and causing such amount to be 10,000 inclusions/g or less, it is possible to reduce the occurrence of rupture of a bonding wire, or reduce the percent defect of a semiconductor device wiring formed by sputtering a high purity copper or copper alloy target with favorable reproducibility.

Based on the foregoing discovery, the present invention provides a high purity copper having a purity of 6N or higher, wherein content of each of the respective components of P, S, O, and C is 1 ppm or less, and nonmetal inclusions having a particle size of 0.5 µm or more and 20 µm or less contained in the copper are 10,000 inclusions/g or less. The high purity copper may also have inclusions of carbon or carbide with a particle size of 0.5 µm or more and 20 µm or less are 5,000 inclusions/g or less.

The present invention additionally provides a method of producing high purity copper based on electrolysis, wherein electrolysis is performed by providing a partition between a cathode and an anode, and, upon supplying electrolyte extracted from an electrolytic cell on the anode side or additional electrolyte to an electrolytic cell on the cathode side, passing the electrolyte through an activated carbon filter immediately before supplying it to the electrolytic cell on the cathode side, and thereafter supplying the electrolyte to the electrolytic cell on the cathode side. The method may produce high purity copper having a purity of 6N or higher, content of each of the respective components of P, S, O, and C being 1 ppm or less, and nonmetal inclusions having a particle size of 0.5 µm or more and 20 µm or less contained in the copper being 10,000 inclusions/g or less achieved based on electrolysis. The method may produce high purity copper based on electrolysis wherein inclusions of carbon or carbide having a particle size of 0.5 µm or more and 20 µm or less contained in the copper are made to be 5,000 inclusions/g or less.

Accordingly, as a result of using high purity copper as the raw material from which harmful P, S, C, O-based inclusions have been reduced and controlling the existence form of nonmetal inclusions, it is possible to reduce the occurrence of rupture of a bonding wire and improve the reproducibility of the mechanical strength, or inhibit the generation of particles upon sputtering a high purity copper or high purity copper target, and a superior effect of being able to reduce the percent defective of the semiconductor device wiring is yielded.

DETAILED DESCRIPTION

P, S, O, and C are particularly problematic as impurities that cause the generation of inclusions. Since the meltability of these elements in copper is extremely low, the bulk thereof becomes inclusions in copper. Particularly, in order to achieve the high purity of copper according to the present invention, it is taboo to add organic additives such as glue or polymer for smoothing or the like which have been conducted conventionally. This is because the addition of such additives will increase the existence of P, S, O, and C. Moreover, electrolyte of a sulfuric acid system that particularly causes nonmetal inclusions, in particular S, to get mixed in was not used, but nitric or hydrochloric electrolyte was used. Nevertheless, even upon taking the foregoing measures, the inclusion of large amounts of P, S, O, and C as impurities was acknowledged. Thus, it was necessary to seek the cause of increase in impurities elsewhere; that is, other than the electrolyte itself.

Thus, through the intense study of the source of inclusions, it has been confirmed that such sources include $SiO_2$, C, and $AS_2O_3$ which are contained in the electrolyte upon performing electrolysis to copper as a result of organic matter eluting from the electrolytic device, particularly piping or the like for supplying and circulating the electrolyte, environment in which the electrolytic device is placed, and as a result of being adhered to the anode. Moreover, P, S, and O that are contained in the electrolyte exist as the suspended solids of CuP, CuS, and CuO, and it has also been discovered that the cathode sometimes causes these suspended solids to be included in the copper during the electrolysis, and that these suspended solids are the primary cause of contamination.

In particular, in cases where the impurities are organic matter, if the electrolytic copper containing organic matter of several ppm or more in a high concentration is to be melted by way of high frequency melting in order to achieve high purity, carbon (C) that is formed as a result of the decomposition of the organic matter will get mixed in as is in the melted copper. In light of the above, it is important to avoid adding additives to the electrolyte, separate the cathode and the anode with a diaphragm, and pass activated carbon through a filter immediately before supplying the electrolyte to the cathode in order to eliminate the organic matter and suspended solids, and it has been discovered that the foregoing process is effective in reducing inclusions.

There are $SiO_2$, C, and $AS_2O_3$, CuP, CuS, CuO and the like as the foregoing impurities, but CuP, CuS, and CuO are copper compounds that hardly become a solid solution in Cu. Meanwhile, C solid matter (graphite), $SiO_2$, and $AS_2O_3$ exist as dust, and these exist as solid matter in the copper structure. The term "nonmetal inclusions" as used in this specification refers to the solid matter existing in the copper structure. Once these solid matters get mixed in, they cannot be eliminated sufficiently in the melting process. Among the above, carbon or carbide having carbon as its component is particularly harmful. In addition, when carbon or carbide having carbon as its component get mixed in upon becoming a bonding wire or in the semiconductor production process, it becomes extremely difficult to eliminate such carbon or carbide. These impurities cause defects in the bonding wire or semiconductor equipment and become even a greater problem pursuant to the miniaturization of such semiconductor equipment.

In light of the above, when producing high purity copper based on electrolysis, upon providing a partition between the anode and the cathode and supplying the electrolyte extracted from the anode-side electrolytic cell (anode box) or the additional electrolyte to the cathode-side electrolytic cell (cathode box), an important process is to pass the electrolyte through an activated carbon filter immediately before supplying such electrolyte to the cathode-side electrolytic cell, and thereafter supplying the electrolyte to cathode-side electrolytic cell to perform electrolysis.

In the foregoing case, for example, the inclusions cannot be eliminated if a standard polypropylene filter is used. Specifically, this means that the elimination of inclusions will be difficult depending on the type of filter. Moreover, if the electrolyte is supplied from the anode box to the cathode box through introduction using a piping or a pump, the reduction of inclusions is similarly difficult. This is because the use of a piping or a pump in itself becomes the contamination source. Although these may seem to be innocent processes, in order to prevent the deterioration of characteristics caused by the existence of trace amounts of minute nonmetal inclusions, utmost attention must also be given even in the foregoing electrolysis process.

The electrolytic production process for producing the high purity copper was described above and the high purity copper of the present invention can only be obtained with the foregoing process. As the starting material, a commercially available high purity copper material having a purity level of 5N or less can be used. Nevertheless, this starting material contains metal components other than Cu, nonmetal components, P, S, O, C and their compounds ($SiO_2$, $AS_2O_3$, CuP, CuS, CuO and so on) each in the amount of several ppm to several 1000 ppm. Although the high purity copper of the present invention uses the foregoing starting material as the raw material, desirably, the high purity copper raw material has a purity of 6N or higher, content of the respective components of P, S, O, and C is 1 ppm or less, and nonmetal inclusions having a particle size of 0.5 μm or more are 10,000 inclusions/g or less.

The foregoing nonmetal inclusions or the carbon system inclusions of carbon or carbide were measured with the "light scattering automatic particle counter for liquid" (manufactured by Kyushu RION Corporation). The measurement method is based on sorting the particle size in the liquid and measuring the particle concentration and particle count. The foregoing measuring equipment is also known as a "liquid particle counter" and is based on JIS B 9925 (this measuring equipment is hereinafter referred to as the "liquid particle counter"). To explain the specific measurement method, 5 g of the raw material was sampled and slowly melted in 200 cc of acid so that the inclusions will not melt, diluted with deionized water to be 500 cc, and 10 cc of this was taken and measured with the liquid particle counter. For example, if the number of inclusions is 800 inclusions/cc, this means that 0.1 g of the sample was analyzed in 10 cc, and the number of inclusions will be 8000 inclusions/g. Note that the number of nonmetal inclusions or the carbon system inclusions of carbon or carbide was measured with the liquid particle counter as described above. However, it should be easily understood that it does not matter upon using other means if similar analysis of the number of inclusions can be performed.

The components of P, S, O, and C all become impurities in copper and form phosphides, sulfides, carbides, and oxides that do not become a solid solution in the copper, and may cause the formation of nonmetal inclusions. Thus, reducing these components to be 1 ppm or less will reduce the nonmetal inclusions and improve the characteristics of high purity copper. The nonmetal inclusions having a particle size of 0.5 μm or more and 20 μm or less contained in the copper are made to be 10,000 inclusions/g or less in the present invention, and the amount of such nonmetal inclusions is the problem. If the number of nonmetal inclusions exceeds 10,000 inclusions/g or less, they will become foreign matter in the thinned bonding wire, and it becomes easier for rupture to occur with such foreign matter as the source. In addition, the nonmetal inclusions in the target will reach a level of becoming problematic, become protrusive foreign matter during the erosion of the target, and abnormal discharge is easily generated to such protrusive foreign matter. This causes the generation of particles during sputtering.

In a bonding wire or a sputtering target, the numerical value of nonmetal inclusions having a particle size of 0.5 μm or more and 20 μm or less being 10,000 inclusions/g or less is not necessarily a large amount. This numerical value cannot be achieved simply by reducing the content of impurity elements configuring the nonmetal inclusions to be 1 ppm or less. Nevertheless, this is important in order to reduce the occurrence of rupture of a bonding wire and improve the reproducibility of the mechanical strength, reduce the percent defective of the semiconductor device wiring that is formed by sputtering a high purity copper target. It is necessary to recognize the importance of this fact as the latest technology. In particular, the existence of inclusions of carbon or carbide is harmful, and it is desirable to reduce the carbon or carbide having a particle size of 0.5 μm or more and 20 μm or less to be 5,000 inclusions/g or less. Since the carbon or carbide is often a result of contamination from organic matter as described above, the use of organic matter in electrolysis must be avoided.

A high purity copper alloy bonding wire or sputtering target can be produced by additionally adding an alloy element with the foregoing high purity copper as the base material. Although there is no particular limitation as the alloy element, the sputtering target may be used upon adding 10% or less of one type or two types or more among the normally added elements of Al, Ag, B, Cr, Ge, Mg, Mn, Nd, Si, Sn, Ti, and Zr to the high purity copper.

Commercially available copper raw materials and alloy component materials may be used as the raw material for producing the high purity copper or high purity copper alloy of the present invention. However, it is desirable to reduce, as much as possible, the impurity content of radioactive elements, alkali metals, transition metals, heavy metals and the like which have an adverse effect on electronic devices or the like especially when using the obtained high purity copper or high purity copper alloy as the raw material of a sputtering target. In particular, with semiconductor equipment, radioactive elements such as U and Th as impurities affect the MOS with their radiation, alkali metals and alkali earth metals such as Na and K deteriorate the MOS interface characteristics, and transition metals or heavy metals such as Fe, Ni, and Co generate an interface state or cause a junction leak, and these elements may contaminate the semiconductor equipment through the copper film. In light of the above, it is desirable to reduce the total amount of alkali metals and alkali earth metals to be 5 ppm or less, the total amount of radioactive elements to be 1 ppb or less, and the total amount of heavy metals and light metals contained as impurities other than the alloy elements to be 10 ppm or less.

A target is usually prepared by melting and casting the raw material, performing such plastic forming processes as forging and rolling as well as heat treatment in order to achieve the appropriate crystal structure, particle size and the like of the cast material, and performing finish processing to obtain the final target size in the shape of a disk or the like. The quality of the target such as its crystal orientation can be adjusted by appropriately combining the plastic forming process such as forging and rolling, and the heat treatment process. The primary inclusions in the copper and copper alloy are oxides, nitrides, carbides, and sulfides, and they are generated in the process of melting and casting the raw material. Thus, melting and casting are performed in a non-oxidizing atmosphere, or preferably in a vacuum for efficiently eliminating oxygen, nitrogen, and sulfur as the inclusion sources. As the melting method, electron beam melting using a water-cooled copper crucible, vacuum induction skull melting, or the use of a water-cooled copper mold is suitable for avoiding the contamination of carbon and oxygen from the graphite crucible used in conventional high frequency melting. When the copper or copper alloy target from which the foregoing impurities and inclusions were reduced is sputtered, the reduction of impurities and inclusions of the target is reflected in the thin film, and it is possible to form a semiconductor device wiring and thin film having the same level of impurities and inclusions.

EXAMPLES

The Examples and Comparative Examples of the present invention are now explained. These Examples are merely illustrative, and the present invention shall in no way be limited thereby. In other words, various modifications and other embodiments based on the technical spirit claimed in the claims shall be included in the present invention as a matter of course.

Example 1

4N—Cu was used as the raw material anode and electrolysis was performed using nitric electrolyte. Here, electrolysis was performed by separating the cathode and the anode with a diaphragm, extracting the Cu ion-containing electrolyte that was eluted from the anode, and passing it through an activated carbon filter with a sieve opening of approximately 0.1 μm immediately before being placed in the cathode box. As a result of subjecting the obtained electrolytic copper to vacuum induction skull melting and measuring the obtained high purity copper with a liquid particle counter, approximately 4,000 inclusions/g of nonmetal inclusions having a particle size of 0.5 μm or more and 20 μm or less were detected. In addition, the P, S, O, and C contained in the electrodeposited copper were all 1 ppm or less. Moreover, the inclusions of carbon or carbide were approximately 600 inclusions/g. These all sufficiently satisfied the conditions of the present invention.

Based on the production conditions of the present invention, Example 1 is able to produce high purity copper having a purity of 6N or higher, wherein content of each of the respective components of P, S, O, and C is 1 ppm or less, and nonmetal inclusions having a particle size of 0.5 μm or more and 20 μm or less contained in the copper are 10,000 inclusions/g or less. However, if the foregoing conditions cannot be achieved, the electrolyte may be additionally passed through the activated carbon filter as needed. This is because the ultimate objective is to produce a sputtering target that is free from the generation of particles or a bonding wire that will not rupture by using the high purity copper of the present invention.

Comparative Example 1

Under the same conditions as Example 1, filtering was performed with a standard polypropylene filter (filtering rate of 0.5 μm). As a result of subjecting the obtained electrolytic copper to vacuum induction skull melting and measuring the obtained high purity copper with a liquid particle counter, approximately 20,000 inclusions/g of nonmetal inclusions having a particle size of 0.5 μm or more and 20 μm or less were detected. In addition, the P, S, O, and C contained in the electrodeposited copper were 2 ppm, 6 ppm, 10 ppm, and 10 ppm, respectively. Moreover, the inclusions of carbon or carbide were approximately 8,400 inclusions/g. None of these satisfied the conditions of the present invention.

Comparative Example 2

The conditions were the same as Example 1, but the Cu ion-containing electrolyte that was eluted from the anode was extracted without using a filter and placed in the cathode box. As a result of subjecting the obtained electrolytic copper to vacuum induction skull melting and measuring the obtained high purity copper with a liquid particle counter, approximately 52,000 inclusions/g of nonmetal inclusions having a particle size of 0.5 μm or more and 20 μm or less were detected. In addition, the P, S, O, and C contained in the electrodeposited copper were respectively 4 ppm, 8 ppm, 20 ppm, and 20 ppm. Moreover, the inclusions of carbon or carbide were approximately 25,000 inclusions/g. None of these satisfied the conditions of the present invention.

Comparative Example 3

Under the same conditions as Example 1, the activated carbon filter was placed immediately after the anode box and the electrolyte was passed therethrough, and returned to the cathode box via a piping and a pump. As a result of subjecting the obtained electrolytic copper to vacuum induction skull melting and measuring the obtained high purity copper with a liquid particle counter, approximately 12,000 inclusions/g of nonmetal inclusions having a particle size of 0.5 μm or more and 20 μm or less were detected. In addition, the P, S, O, and C contained in the electrodeposited copper were respectively 1 ppm, 4 ppm, 2 ppm, and 3 ppm. Moreover, the inclusions of carbon or carbide were approximately 6,500 inclusions/g. Although the results showed fewer inclusions and impurities of P, S, O, C in comparison to Comparative Example 1 or Comparative Example 2, they increased in comparison to Example 1. Although the use of a piping and a pump was merely added, it was not possible to achieve the objective of reducing the inclusions or impurities.

Evaluation of Target Based on Nonmetal Inclusions

Subsequently, the high purity copper of Example 1 prepared as described above was melted to produce a target.

As a result of measuring this target with a liquid particle counter, the nonmetal inclusions having a particle size of 0.5 μm or more and 20 μm or less were approximately 6,500 inclusions/g. The increase of nonmetal inclusions was acknowledged at the stage of producing the target. However, the amount was small. This is considered to be a result of the number of nonmetal inclusions contained in the raw material itself to be melted being small. Accordingly, as explained below, upon sputtering this target, the result was the generation of few particles.

As a result of performing electrolytic etching to this target and analyzing the protrusive nonmetal inclusions that appeared on the surface using FIB-AES, 40% of the overall nonmetal inclusions was carbon-based inclusions (carbon and carbide), and the number of carbon-based inclusions having a particle size of 0.5 μm or more and 20 μm or less was approximately 3,500 inclusions/g. As a result of sputtering this target and depositing a copper thin film on a 300 mm wafer, the number of particles having a particle size of 0.05 μm or more was 17 particles/square inch, and it was possible to obtain a favorable sputtered film.

Application to a Bonding Wire

Upon producing a bonding wire, the processes of melting the high purity copper of Example 1, and additionally subjecting this to casting, forging, heat treatment and rolling (drawing) are performed. The process is basically the same as producing the foregoing target. Accordingly, it is effective to use the cold crucible melting method in order to prevent the inclusion of impurities in the melting process and obtain an ingot. As a result of similarly performing electrolytic etching to the bonding wire and analyzing the protrusive nonmetal inclusions that appeared on the surface using FIB-AES, 40% of the overall nonmetal inclusions was carbon-based inclusions (carbon and carbide), and the number of carbon-based inclusions having a particle size of 0.5 μm or more and 20 μm or less was approximately 4,200 inclusions/g. The existence of few nonmetal inclusions as described above is able to effectively inhibit the rupture of the bonding wire.

Evaluation of Comparative Example 1 to Comparative Example 3

The foregoing high purity copper was processed and subject to heat treatment to produce a target. As a result of measuring the target with a liquid particle counter, the number of nonmetal inclusions having a particle size of 0.5 μm or more and 20 μm or less was approximately 30,000 inclusions/g or more. At the stage of producing this target, the increase of nonmetal inclusions was acknowledged in proportion to the raw material. Moreover, the amount of increase was significant. This may be caused by a result that the number of nonmetal inclusions contained in the raw material itself to be melted is great. Accordingly, upon sputtering this target, the result was the proportional increase in the generation of particles.

Application of Comparative Example 1 to Comparative Example 3 to a Bonding Wire

This is also similar to the production process of the target as described above. As a result of measuring the bonding wire with a liquid particle counter, the number of nonmetal inclusions having a particle size of 0.5 μm or more and 20 μm or less was similarly approximately 30,000 inclusions/g or more. At the stage of producing this bonding wire, the increase of nonmetal inclusions was acknowledged in proportion to the raw material. Moreover, the amount of increase was significant. Accordingly, the rupture off the bonding wire increased in proportion to the abundance of nonmetal inclusions.

Provided is a high purity copper from which harmful P, S, C, O inclusions have been reduced. As a result of controlling the existence form and amount of nonmetal inclusions, it is possible to reduce the occurrence of rupture of a bonding wire and improve the reproducibility of the mechanical strength, or inhibit the generation of particles upon sputtering a high purity copper or high purity copper target, and a superior effect of being able to reduce the percent defective of the semiconductor device wiring is yielded. Accordingly, under the recent circumstances where LSI semiconductor devices are subject to higher integration and the linewidth thereof being miniaturized to 0.25 µm or less, the present invention is effective as a high purity copper and high purity copper alloy target and a bonding wire that will not rupture easily which are suitable for forming a copper wiring or the like that is capable of preventing problems such as short circuits and disconnections.

We claim:

1. A method of producing high purity copper, comprising the steps of:

performing electrolysis using nitric or hydrochloric acid as electrolyte in an electrolytic cell having a partition provided by a diaphragm extending between a cathode and a copper anode of a purity of 5N or less such that a cathode side and an anode side are defined within the electrolytic cell;

during said electrolysis step, extracting the electrolyte from the anode side of the electrolytic cell;

passing the electrolyte extracted during said extracting step through an activated carbon filter; and immediately supplying the electrolyte passed through the activated carbon filter during said passing step to the cathode side of the electrolytic cell after the electrolyte passes through the activated carbon filter; and as a result of the electrolysis, electrodepositing copper of a purity of 6N or higher on the cathode.

2. The method of producing high purity copper according to claim 1, wherein the copper obtained as a result of the electrolysis contains 1 ppm or less of each of P, S, O, and C and contains nonmetal inclusions having a particle size of 0.5 µm or more and 20 µm or less in an amount of 10,000 inclusions/g or less.

3. The method of producing high purity copper according to claim 2, wherein the copper obtained as a result of the electrolysis contains inclusions of carbon or carbide having a particle size of 0.5 µm or more and 20 µm or less in an amount of 5,000 inclusions/g or less.

4. The method of producing high purity copper according to claim 1, wherein the copper obtained as a result of the electrolysis contains inclusions of carbon or carbide having a particle size of 0.5 µm or more and 20 µm or less in an amount of 5,000 inclusions/g or less.

* * * * *